United States Patent
Van Winkle, Sr.

[11] Patent Number: 5,942,017
[45] Date of Patent: Aug. 24, 1999

[54] ELECTRONIC EQUIPMENT AIR CONDITIONER AND PURIFIER

[76] Inventor: Frank A. Van Winkle, Sr., 1321 Avalon Ct., Kokomo, Ind. 46902

[21] Appl. No.: 09/046,206

[22] Filed: Mar. 23, 1998

[51] Int. Cl.$^6$ .................................................. B01D 46/46
[52] U.S. Cl. ......................... 55/385.1; 55/385.6; 55/481; 55/485; 55/486
[58] Field of Search ............... 55/385.1, 385.6, 55/481, 485, 486; 261/DIG. 65

[56] References Cited

U.S. PATENT DOCUMENTS

| | | | |
|---|---|---|---|
| 4,784,675 | 11/1988 | Leber et al. | 55/385.1 |
| 4,889,542 | 12/1989 | Hayes | 55/385.6 |
| 5,160,357 | 11/1992 | Faber | 55/385.6 |
| 5,223,006 | 6/1993 | Moran, III | 55/385.6 |
| 5,305,494 | 4/1994 | Candler | 55/385.1 |
| 5,431,974 | 7/1995 | Pierce | 55/385.6 |
| 5,730,770 | 3/1998 | Greisz | 55/385.6 |
| 5,785,723 | 7/1998 | Beran et al. | 55/385.1 |

*Primary Examiner*—Jay H. Woo
*Assistant Examiner*—Minh-Chau T. Pham
*Attorney, Agent, or Firm*—Michael I. Kroll

[57] ABSTRACT

An electronic equipment air conditioner and purifier for providing purified air to an electronic device. The electronic equipment air conditioner and purifier includes a housing including an air intake port and an air outlet port. A blower is positioned within the housing for drawing air into the housing through the air intake port. A filter is provided for filtering the air drawn through the air intake port by the blower to produce filtered air. Moisture is then removed from the filtered air by a humidifier and evaporator to produce filtered and dehumidified air. A hose is removably connected to the air outlet port for supplying the filtered and dehumidified air to the electronic device. The electronic equipment air conditioner and purifier also includes a control panel for manually controlling the speed at which the blower draws air through the air intake port, the temperature of the air drawn in and the humidity of the air. The hose includes a manifold removably secured to and covering the air intake louvers of the electronic device preventing any unfiltered air from entering therethrough.

6 Claims, 6 Drawing Sheets

ELECTRONIC EQUIPMENT AIR CONDITIONER AND PURIFIER

BACKGROUND OF THE INVENTION

1. Field of the Invention

The present invention relates generally to devices for filtering the air and, more specifically, to a device for removing contaminants and moisture from the air and feeding the filtered air to an electronic device thereby prolonging the life of the device by reducing the deterioration rate of the circuit boards therein.

2. Description of the Prior Art

Numerous air purifying devices have been provided in the prior art. For example, U.S. Pat. Nos. 4,376,642; 5,055,118; 5,133,788 and 5,549,735 are illustrative of such prior art. While these units may be suitable for the particular purpose to which they address, they would not be as suitable for the purposes of the present invention as heretofore described.

U.S. Pat. No. 4,376,642

Inventor: Nigel C. Verity

Issued: Mar. 15, 1983

The invention relates to a portable air cleaner unit which includes a casing having an air inlet and an outlet and defining an air cleaning path between the inlet and outlet. A prefilter is disposed downstream of the air inlet and a main filter is disposed downstream of the prefilter. An air mover such as a fan is disposed downstream of the main filter, and an exposed negative ion source is disposed downstream of the fan on the external surface of the air outlet. In accordance with the invention, the main filter consists of fibers shredded from a non-carcinogenic plastic membrane which has been permanently electrostatically charged. The negative ion source ionizes the cleaned air as it leaves the cabinet.

U.S. Pat. No. 5,055,118

Inventor: Hitoshi Nagoshi et al.

Issued: Oct. 8, 1991

A first insulation layer, a first conductive layer, a second insulation layer and a second conductive layer are laminated, and a larger spatial gap between either one of the first conductive layer and the second conductive layer and the opposite layer thereto than that between the other conductive layer and the opposite layer thereto is made, and high voltage is applied across both conductive layers and when charged dusts pass therethrough, the charged dusts are attached on only one of the conductive layer. These charged dusts are electrically neutralized, and thereby, it becomes possible to prevent weakening of the electric field and declination of the dust-collecting ratio through lapse of time.

U.S. Pat. No. 5,133,788

Inventor: Alan L. Backus

Issued: Jul. 28, 1992

An air cleaning device produces a vertical plane of moving air to block migration of airborne impurities from one area to another, and to create a low pressure area which remotely attracts impure ambient air to it. The device may have one or more restricted air inlets orthogonal to the vertical plane of moving air, with restrictions creating increased air velocity at the inlets resulting in a low pressure zone which attracts impure ambient air to the inlets. A single stage activated charcoal filter which removes chemicals and odors may be provided within the device, as well as an ionizer which electrostatically removes particulates.

U.S. Pat. No. 5,549,735

Inventor: Rex R. Coppom

Issued: Aug. 27, 1996

The particle collection efficiency of a fibrous filter is significantly increased by imposing a high voltage potential on electrodes placed on either side of the filter. This creates a strong electrostatic field across the filter which electrically enhances the fiber's particle collection ability. The electrostatic field strength, and particle collection efficiency, increase with the voltage employed to establish the electrostatic field. An insulated electrode as the front electrode in combination with a conductive electrode as the rear electrode enables a very high electrical potential to be imposed on the electrodes without resulting in arcing between electrodes. Pre-charging of dust particulates with the same polarity as the insulated electrodes further increases collection efficiency without resulting in a charge buildup in front of the electrodes or a blocking of airflow by particles collecting on the electrodes.

SUMMARY OF THE INVENTION

The present invention relates generally to devices for filtering the air and, more specifically, to a device for removing contaminants and moisture from the air and feeding the filtered air to an electronic device thereby prolonging the life of the device by reducing the deterioration rate of the circuit boards therein.

A primary object of the present invention is to provide an electronic equipment air conditioner and purifier that will overcome the shortcomings of the prior art devices.

Another object of the present invention is to provide an electronic equipment air conditioner and purifier that removes contaminants and moisture from the air and supplies the purified, filtered air to a desired piece of electronic equipment.

An additional object of the present invention is to provide an electronic equipment air conditioner and purifier that will increase the life of the electronic equipment by reducing the rate of deterioration of the circuit boards within the electronic equipment.

A still further object of the present invention is to provide an electronic equipment air conditioner and purifier that will reduce the heat level built up within the electronic equipment during use.

An even further object of the present invention is to provide an electronic equipment air conditioner and purifier that is simple and easy to use.

A still further object of the present invention is to provide an electronic equipment air conditioner and purifier that is economical in cost to manufacture.

Further objects of the invention will appear as the description proceeds.

An electronic equipment air conditioner and purifier for providing purified air to an electronic device is described by the present invention. The electronic equipment air conditioner and purifier includes a housing having an air intake port and an air outlet port. A blower is positioned within the housing for drawing air into the housing through the air intake port. A filter is provided for filtering the air drawn through the air intake port by the blower to produce filtered air. Moisture is then removed from the filtered air by a humidifier and evaporator to produce filtered and dehumidified air. A hose is removably connected to the air outlet port for supplying the filtered and dehumidified air to the electronic device. The electronic equipment air conditioner and purifier also includes a control panel for manually controlling the speed at which the blower draws air through the air intake port, the temperature of the filtered air and the humidity of the filtered air. The hose includes a manifold removably secured to and covering the air intake louvers of the electronic device preventing any unfiltered air from entering therethrough.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become more fully appreciated as the same becomes better understood when considered in conjunction with the accompanying drawings, in which like reference characters designate the same or similar parts throughout the several views.

DESCRIPTION OF THE REFERENCE NUMERALS

Figure 1:
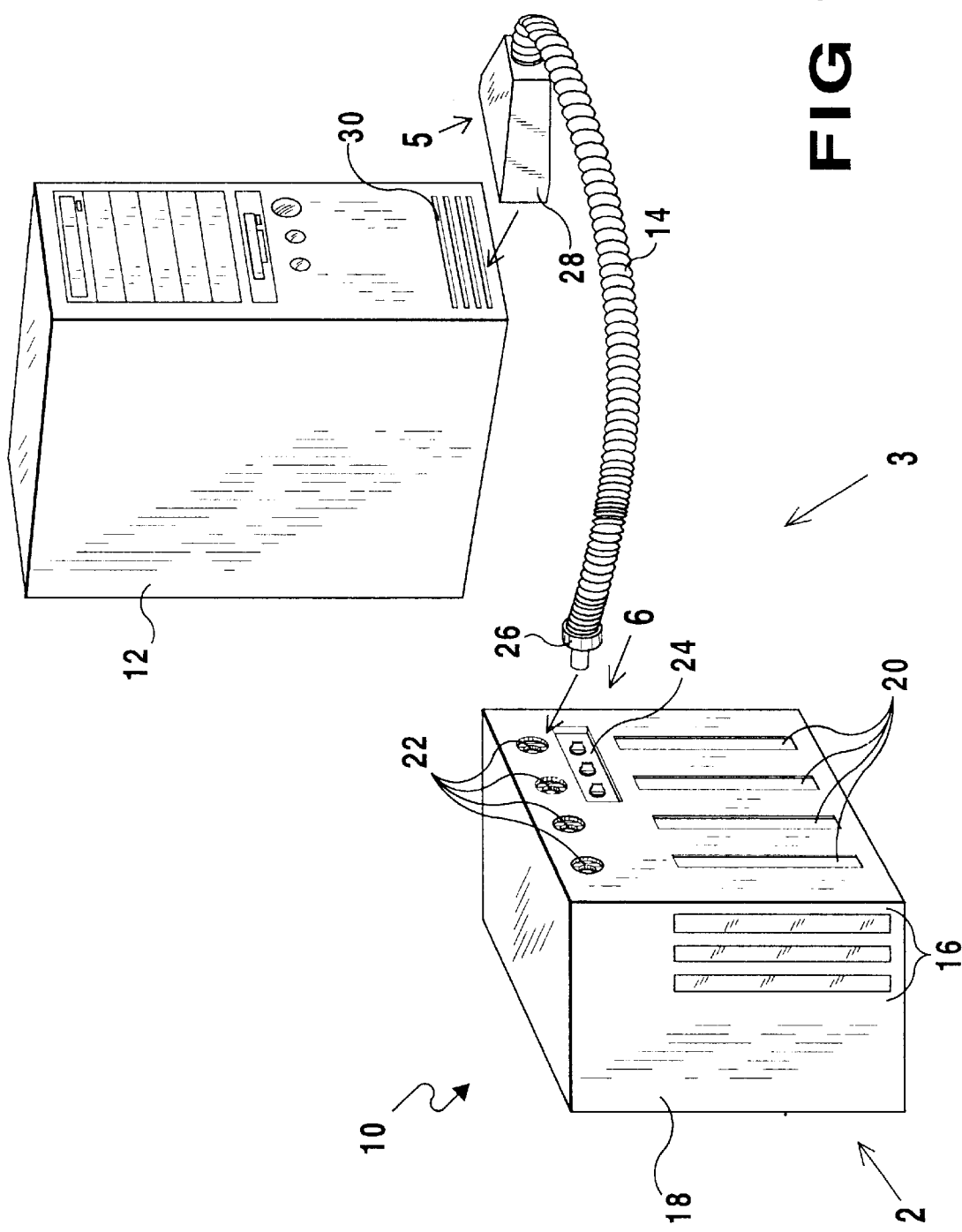
FIG. 1 is a top perspective view of the electronic equipment air conditioner and purifier of the present invention illustrating the connections for use with an electronic device.

Turning now descriptively to the drawings, in which similar reference characters denote similar elements throughout the several views, the Figures illustrate the electronic equipment air conditioner and purifier of the present invention. With regard to the reference numerals used, the following numbering is used throughout the various drawing figures.

10 electronic equipment air conditioner and purifier
12 electronic device
14 hose connecting electronic equipment air conditioner and purifier and electronic device
16 air filters within electronic equipment air conditioner and purifier 18 housing of electronic equipment air conditioner and purifier
20 air intake ports
22 air output ports
24 control panel
26 adapter on hose for connection with air output ports
28 manifold on hose for connection to electronic device
30 air intake louvers on electronic device
32 computer connected to receive purified air through hose
34 television connected to receive purified air through hose
36 video cassette recorder connected to receive purified air through hose
37 sound system
38 ambient air
40 blower
42 first filter
44 second filter
46 third filter
48 electrode of third filter
50 collector plate of third filter
52 evaporator
54 evaporator drain pipe
56 drain pan
58 humidity damper
60 purified air chamber
62 air flowing through hose
64 recess in air outlet ports
66 extending protrusion on adapter of hose
68 face side of manifold of hose
70 adhesive substance on face side of manifold
72 protective cover for adhesive substance on manifold
74 knob for controlling speed of rotation of blower
76 bknob for controlling temperature of filtered air
78 knob for controlling humidity of air

DETAILED DESCRIPTION OF THE PREFERRED EMBODIMENT

Turning now descriptively to the drawings, in which similar reference characters denote similar elements throughout the several views, FIGS. 1 through 6 illustrate the electronic equipment air conditioner and purifier of the present invention. The electronic equipment air conditioner and purifier is indicated generally by the reference numeral 10.

The electronic equipment air conditioner and purifier 10 is clearly illustrated in FIG. 1 for connection to an electronic device 12 by a hose 14. The electronic equipment air conditioner and purifier 10 includes a plurality of filters 16 positioned within a housing 18 defining the size and shape of the electronic equipment air conditioner and purifier 10. Air is drawn into the housing 18 through air vents 20 and passes through the filters 16. The housing 18 also includes a plurality of air outlet ports 22 for passage of the filtered air out of the electronic equipment air conditioner and purifier 10. A control panel 24 allows the user to control the pressure, temperature and humidity level of the air passing out of the electronic equipment air conditioner and purifier 10 as will be described hereinafter with specific reference to FIG. 6.

The hose 14 includes an adapter 26 on one end thereof for connection to and mating with at least one of the plurality of air outlet ports 22 and a manifold 28 on the other end thereof. The manifold 28 is for positioning over the air intake louvers 30 of the electronic device 12 thereby supplying the purified and dehumidified air to the electronic device 12. The supply of purified air to the electronic device 12 and covering of the air intake louvers 30 by the manifold 28 prevents the electronic device 12 from drawing in air having contaminants contained therein. By regulating the air supplied to the electronic device 12 the temperature within the electronic device 12 is able to be controlled thereby preventing the electronic device 12 from overheating and extending the life of the electronic device 12.

A computer processor is illustrated in FIG. 1 as the device being connected to the electronic equipment air conditioner and purifier 10 via the hose 14. The depiction of a computer processor is for purposes of description only and not meant to limit the uses of the electronic equipment air conditioner and purifier 10 in any way. The electronic equipment air conditioner and purifier 10 may be used to supply purified air to any electronic device 12 which draws in air through an air intake port or air intake louvers 30.

Figure 2:
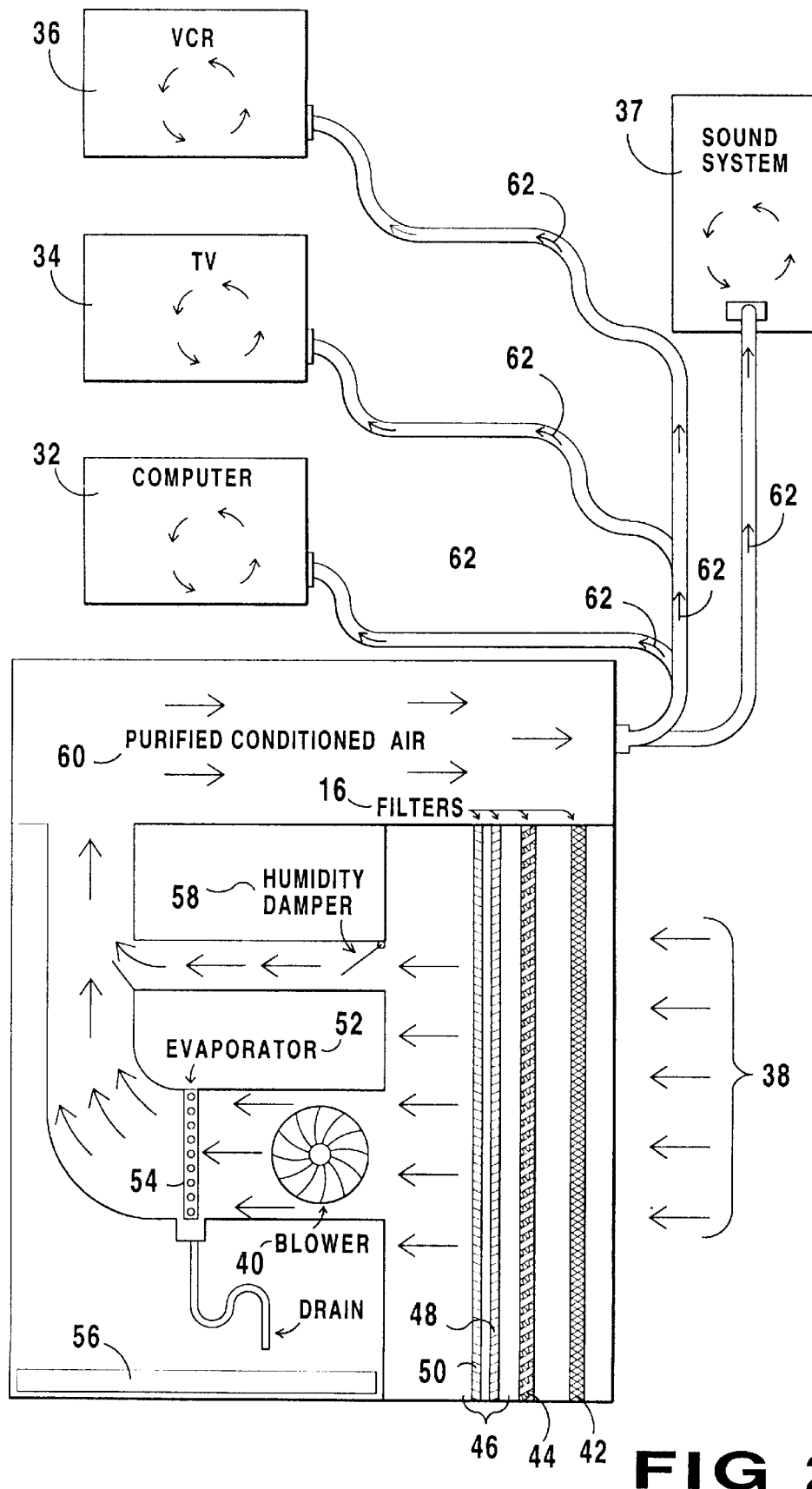
FIG. 2 is a block diagram of the electronic equipment air conditioner and purifier of the present invention showing the flow of air through the electronic equipment air conditioner and purifier.

FIG. 2 is a block diagram illustrating the internal components of the electronic equipment air conditioner and purifier 10 connected to supply purified air to a computer 32, a television 34, a video cassette recorder 36, and a sound system or stereo 37 at the same time. The ambient air surrounding the electronic equipment air conditioner and purifier 10 and illustrated by the arrows labeled 38 is drawn into the housing 18 and through the filters 16 by a blower 40. The blower 40 is preferably in the form of a fan acting to pull air from outside the housing 18 through the air inlets 20 and filters 16.

The filters 16 are preferably formed of a series of filters acting to remove particulates and contaminants in the air 38. The first filter 42 is preferably made of a washable reusable material able to collect the largest size particles and contaminants such as hair, lint and dust found in the air 38. A second filter 44 is positioned on a side of the first filter 42 opposite the air intake ports 20 and is made of a finer material than the first filter 42. The second filter 44 is preferably made of paper or any synthetic material which is able to remove finer particles of dust and dirt able to pass through the first filter 42. A third filter 46 may be positioned on a side of the second filter 44 opposite the first filter 42. The third filter 46 is preferably an electrostatic filter which acts to purify the air filtered by the first and second filters 42 and 44 respectively by removing smoke and other very fine air borne pollutants by drawing the air over a first electrode 48. The first electrode 48 acts to generate an electrical charge on the particles passing therethrough and provides the electrically charged air to a collector plate 50 of opposite charge which attracts all the charged particles and thus removes the remaining pollutants from the air 38.

Figure 6:
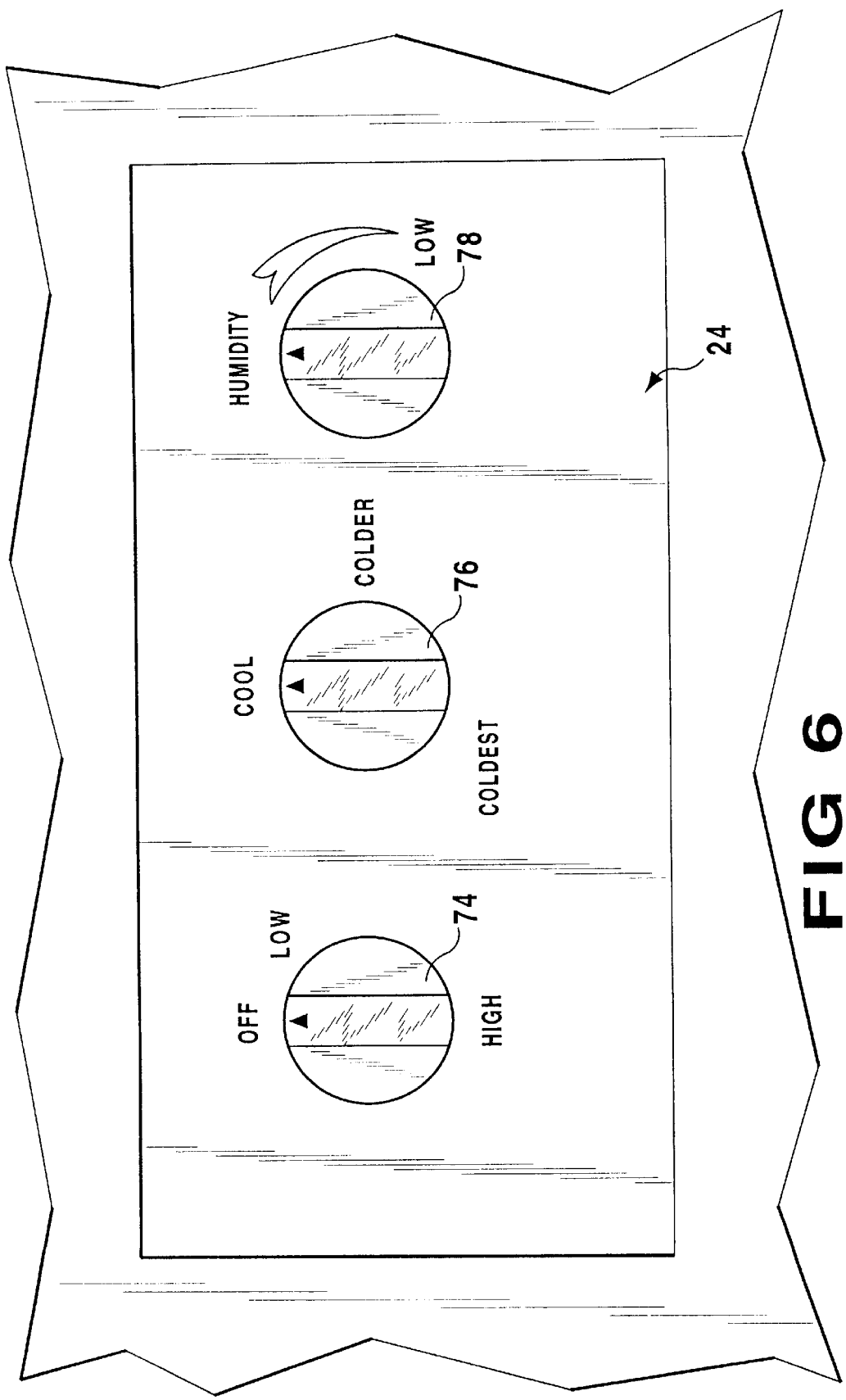
FIG. 6 is a front elevational view of the control panel of the electronic equipment air conditioner and purifier of the present invention.

A portion of the air 38 drawn through the filters 16 is caused to pass through an evaporator 52 which induces condensation with the moisture produced being drained through evaporator tubes 54 and collected in a drainage pan 56 from which the moisture can be disposed. The remainder of the air 38 passes through a humidity damper 58 regulated by a controllable humidistat as will be described in greater detail with specific reference to FIG. 6 showing the control panel 24. The humidity damper 58 controls the humidity of the filtered air prior to passing the air to the purified air chamber 60. The air within the purified air chamber 60 is supplied through the hose 14 to the electronic devices 32, 34, 36 and 37 connected thereto as illustrated by the arrows labeled 62.

Figure 3:
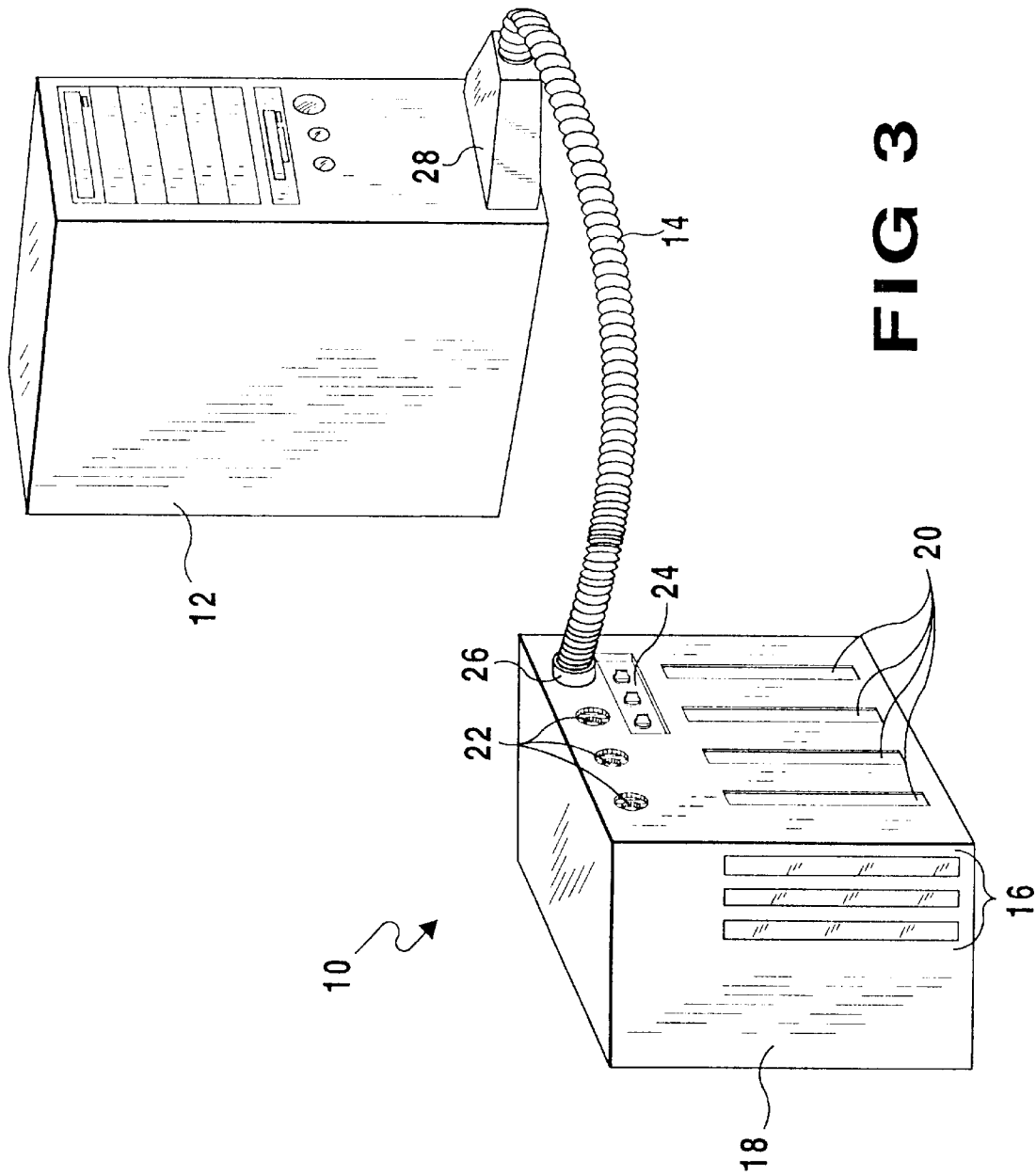
FIG. 3 is a top perspective view of the electronic equipment air conditioner and purifier of the present invention connected to an electronic device through the hose.

The electronic equipment air conditioner and purifier 10 is shown connected to a electronic device 12 through the hose 14 in FIG. 3. From this figure it is clearly seen that the adapter 26 of the hose 14 is connected to one of the air outlet ports 22 for receiving air treated and filtered by the electronic equipment air conditioner and purifier 10. The manifold 28 of the hose 14 is positioned to cover the air intake louvers 30 of the computer processor 12. The manifold 28 is held in place over the air intake louvers 30 by a connection device as will be discussed hereinafter with specific reference to FIG. 5. By completely covering the air intake louvers 30, the manifold 28 prevents any air not supplied by the electronic equipment air conditioner and purifier 10 through the hose 14 from entering the computer processor 12 through the air intake louvers 30. Thus, only air filtered and dehumidified by the electronic equipment air conditioner and purifier 10 is supplied through the hose 12 and the manifold 28 to the computer processor 12. The quality of air entering the computer processor 12 and the temperature within the computer processor 12 is thereby controlled by the electronic equipment air conditioner and purifier 10 providing the computer processor 12 with an extended life expectancy.

Figure 4:
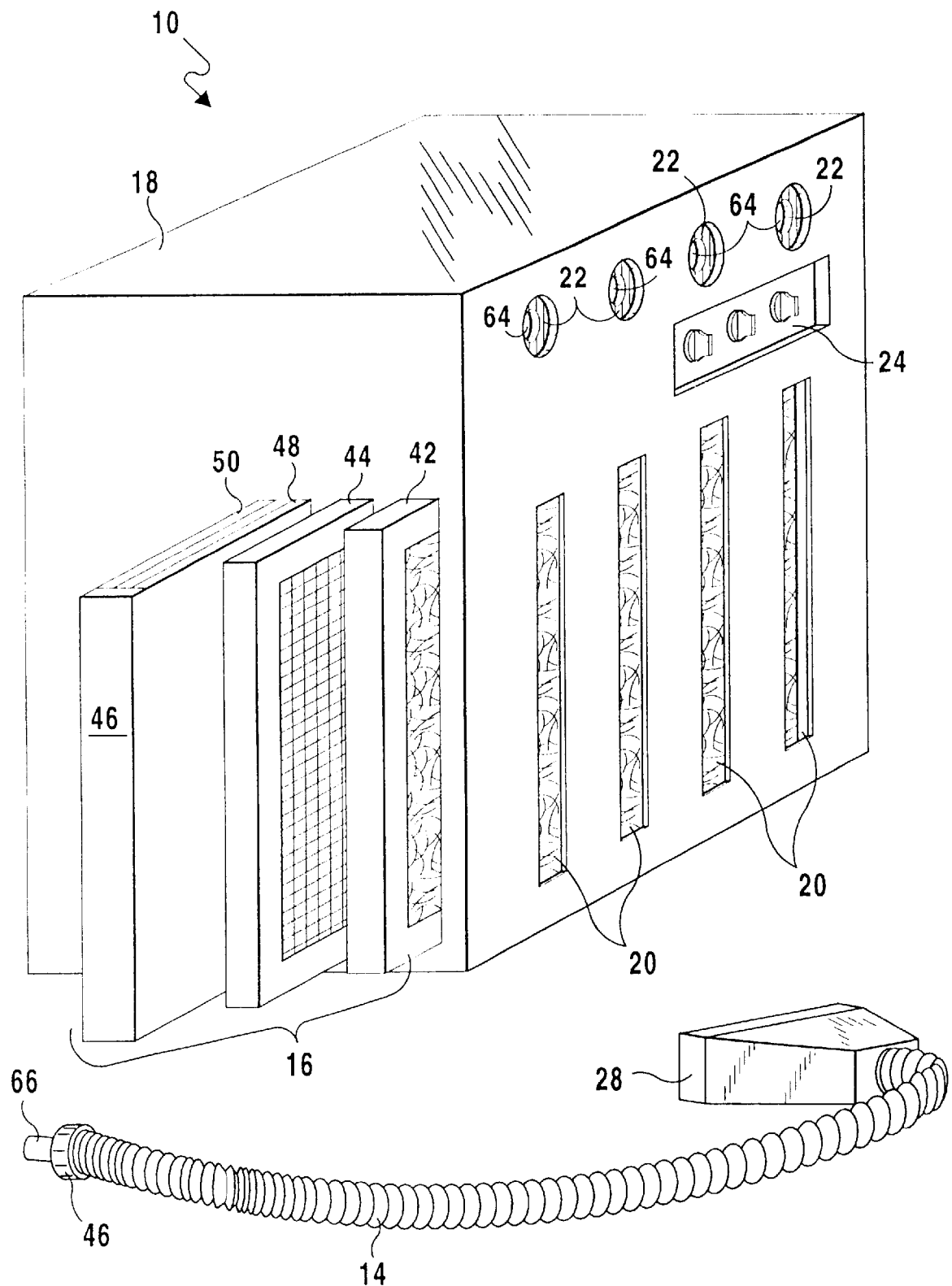
FIG. 4 is a side perspective view of the electronic equipment air conditioner and purifier of the present invention including the hose for connection with an electronic device.

FIG. 4 is an enlarged view of the electronic equipment air conditioner and purifier 10 illustrating the filters 16 partially removed from their position within the housing 18. As can be seen from this view, the filters 16 are removably positioned within the housing 18 and thus can be either cleaned and returned to their position within the housing 18 or replaced when they have outlived their usefulness. The air outlet ports include a recess 64 extending into the purified air compartment 60 for receiving an extending protrusion 66 on the adapter 26 of the hose 14. When the extending protrusion 66 is inserted into a recess 64 of one of the air outlet ports 22 air within the purified air chamber 60 will flow into and through the hose 14. The air flowing through the hose 14 will exit the hose 14 through the manifold 28.

Figure 5:
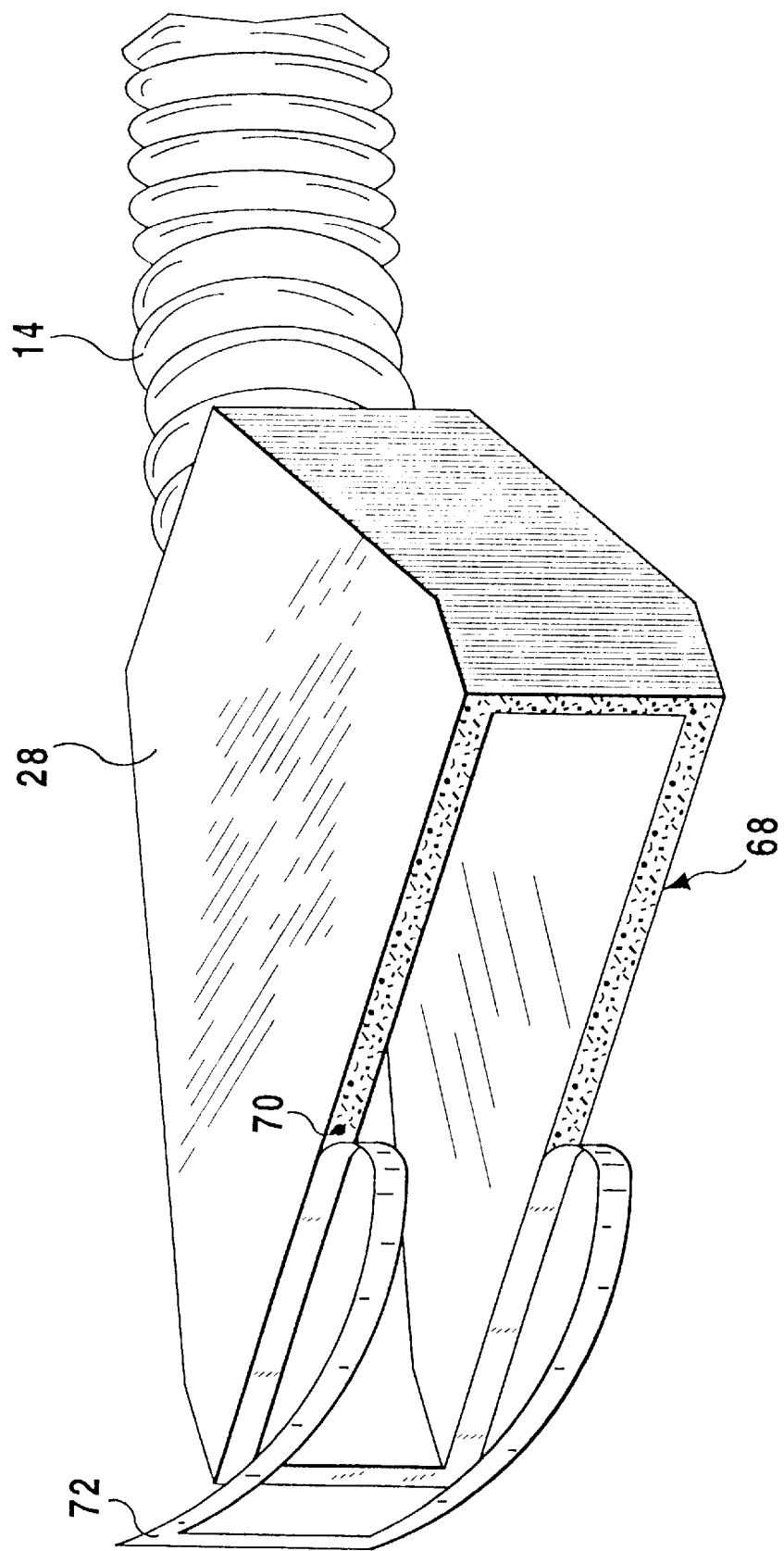
FIG. 5 is a top perspective view of the hose and manifold portion of the hose of the electronic equipment air conditioner and purifier of the present invention.

FIG. 5 is an enlarged view of the manifold 28 of the hose 14. This view shows the face side 68 of the manifold 28. Positioned on the face side 68 of the manifold 28 is an adhesive substance 70 which is covered by a protective sheet 72 prior to use. The adhesive substance 70 is used to secure the manifold 28 over the air intake louvers 30 of the electronic device 12 and thus provide purified air from the electronic equipment air conditioner and purifier 10 to the electronic device 12. The depiction of the adhesive substance 70 is for purposes of example only and not meant to limit the scope of the invention in any way. In practice, any type of connection device for securing the manifold 28 over the air intake louvers 30 may be used.

An enlarged view of the control panel 24 is illustrated in FIG. 6. From this view a first control knob 74 connected to the blower 40 is illustrated for use in controlling the speed at which the blower 40 turns. By controlling the speed of the blower 40 the amount of air drawn in from the ambient atmosphere surrounding the electronic equipment air conditioner and purifier 10 may be controlled and thus the amount of air flowing through the hose 14 and to the electronic device 12 is controlled. A second control knob 76 is connected to the evaporator 52 for controlling the temperature of the air flowing through the electronic equipment air conditioner and purifier 10 to the hose 14 and the electronic device 12. This knob 76 can be used to control the temperature of the air flowing to the electronic device 12 and thus control the temperature within the electronic device 12. This prolongs the life of the electronic device 12 by preventing overheating of its electrical circuits. A third control knob 78 is connected to the humidity damper 58 thereby controlling the amount of humidity in the air drawn into the electronic equipment air conditioner and purifier 10. This will control the moisture level of the air being delivered to the electronic device 12 and thus reduce the deterioration of the electrical circuits within the electronic device 12 by removing the moisture from the air supplied thereto.

The operation of the electronic equipment air conditioner and purifier will now be described with reference to the Figures. In operation, the electronic equipment air conditioner and purifier is positioned adjacent the electronic devices to which it is desired to supply filtered air. The adapter 26 of the hose 14 is inserted into one of the air outlet ports 22 and the protective sheet 72 is removed from the face side of the manifold 28. The adhesive 70 on the manifold 28 is then positioned to cover the air intake louvers 30 on the electronic device 12. The manifold 28 is secured in position by applying a force on the manifold 28 towards the electronic device 12 thereby causing the adhesive 70 to contact and adhere to the electronic device 12. As previously stated the use of an adhesive 70 to secure the manifold 28 over the air intake louvers 30 is for purposes of example only. Any known device for securing the manifold 28 over the air intake louvers 30 to prevent air surrounding the electronic device 12 to be drawn therein may be used. Furthermore, the manifold 28 may be releasably secured to the electronic device 12 thereby allowing the electronic equipment air conditioner and purifier 10 and the electronic device 12 to be used separately and facilitate moving of the individual devices.

Once the hose 14 is in place connecting the electronic equipment air conditioner and purifier 10 to the electronic device 12, the first knob 74 is turned. This turns the electronic equipment air conditioner and purifier 10 on causing the blower 40 to begin drawing air through the air intake ports 20 and the filters 16. The filters 16 act to filter the air drawn in through the air intake ports 20 by removing particles, contaminants and dust floating therein and therewith. The filtered air is supplied to an evaporator 52 and a humidity damper 58 for controlling the temperature and humidity of the filtered air. The temperature and humidity may be manually adjusted by turning the second and third knobs 76 and 78. The evaporator 52 and humidity damper 58 act to reduce the moisture in the air and deposit any removed moisture in a collection plate 56. The filtered and dehumidified air is then supplied to a purified air chamber 60.

The air within the purified air chamber 60 will be drawn through the hose 14 by a blower within the electronic device 12 and supplied through the manifold 28 and air intake louvers 30 to the electronic device 12. The air supplied through the air intake louvers 30 for cooling the electrical circuits of the electronic device 12 is thus filtered and dehumidified.

Any number of electronic devices may be connected to receive filtered and dehumidified air from the electronic equipment air conditioner and purifier 10 as illustrated in FIG. 2. Only additional hoses 14 will be needed. Each hose 14 can be connected to a respective air outlet port 22. Hoses having one adapter and numerous manifolds can also be used to provide filtered and dehumidified air to a number of electronic devices 12 through a single hose 14.

From the above description it can be seen that the electronic equipment air conditioner and purifier of the present invention is able to overcome the shortcomings of the prior art devices by providing an electronic equipment air conditioner and purifier which is able to remove contaminants and moisture from the air and supplies the purified air to electronic equipment and thereby increase the life of the electronic equipment by reducing the rate of deterioration of the circuit boards within the electronic equipment. The electronic equipment air conditioner and purifier also reduces the heat level built up within electronic equipment during use. Furthermore, the electronic equipment air conditioner and purifier is simple and easy to use and economical in cost to manufacture.

It will be understood that each of the elements described above, or two or more together may also find a useful application in other types of methods differing from the type described above.

While certain novel features of this invention have been shown and described and are pointed out in the annexed claims, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. An electronic equipment air conditioner and purifier for providing purified air to a plurality of electronic devices, said electronic equipment air conditioner and purifier comprising:

a) a housing including an air intake port and a plurality of air outlet ports;

b) means for drawing air into the housing through said air intake port;

c) means for filtering the air drawn into the housing to produce filtered air;

d) means for cooling and removing moisture from the filtered air to produce filtered and dehumidified air for delivery to said electronic devices;

e) a control panel including a first control knob for controlling an amount of air drawn through said air intake port, a second control knob for selecting a temperature of the filtered air to be delivered to said electronic devices, and a third control knob for selecting a moisture level of the filtered air to be delivered to said electronic devices;

f) said means for cooling and removing moisture comprising means for cooling a portion of said filtered air and means for dehumidifying a separate portion of said filtered air and mixing the cooled and dehumidified air to obtain the selected degree of cooling and dehumidification of the filtered air being delivered to said electronic devices;

g) a hose removably connected to each air outlet port for supplying the filtered and dehumidified air to each electronic device; and h) each said hose including a manifold for covering an air intake port of a selected electronic device to which said hose is supplying air said manifold having a face side which contacts said selected electronic device covering the air intake port of said selected electronic device, said face side being coated with an adhesive and a peel off layer to expose said adhesive upon removal.

2. The electronic equipment air conditioner and purifier as recited in claim 1, wherein said means for filtering is removably positioned within said housing.

3. The electronic equipment air conditioner and purifier as recited in claim 2, wherein said means for filtering includes first, second and third filters.

4. The electronic equipment air conditioner and purifier as recited in claim 3, wherein said first filter is a coarse filter for removing hair, lint and dust from the air drawn through said air intake port.

5. The electronic equipment air conditioner and purifier as recited in claim 4, wherein said second filter is finer than said first filter removing smaller particles passing through said first filter from the air.

6. The electronic equipment air conditioner and purifier as recited in claim 5, wherein said third filter is an electrostatic filter including an electrode for inducing an electrical charge on particles passing through said second filter and a charged collection plate for attracting and collecting particles charged by said electrode.

* * * * *